(12) United States Patent
Koumoto

(10) Patent No.: US 8,519,570 B2
(45) Date of Patent: Aug. 27, 2013

(54) TRAVELING VEHICLE SYSTEM

(75) Inventor: Homare Koumoto, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 463 days.

(21) Appl. No.: 13/001,463

(22) PCT Filed: Jun. 19, 2009

(86) PCT No.: PCT/JP2009/002790
§ 371 (c)(1),
(2), (4) Date: Dec. 27, 2010

(87) PCT Pub. No.: WO2010/001540
PCT Pub. Date: Jan. 7, 2010

(65) Prior Publication Data
US 2011/0101792 A1 May 5, 2011

(30) Foreign Application Priority Data
Jul. 4, 2008 (JP) .................. 2008-176048

(51) Int. Cl.
*H01F 27/42* (2006.01)
(52) U.S. Cl.
USPC ........................................ 307/104
(58) Field of Classification Search
USPC ........................................ 307/104
See application file for complete search history.

(56) References Cited

U.S. PATENT DOCUMENTS

| 4,800,328 A | 1/1989 | Bolger et al. |
| 2004/0119340 A1 | 6/2004 | Nishino |
| 2004/0183640 A1 | 9/2004 | Bohler et al. |
| 2009/0003022 A1 | 1/2009 | Nunoya et al. |

FOREIGN PATENT DOCUMENTS

| CN | 1468462 A | 1/2004 |
| CN | 1511383 A | 7/2004 |
| CN | 1938933 A | 3/2007 |
| CN | 101090354 A | 12/2007 |
| JP | 63-73837 A | 4/1988 |
| JP | 2001-268823 A | 9/2001 |
| JP | 2001-309501 A | 11/2001 |
| JP | 2002-234366 A | 8/2002 |
| JP | 2004-120880 A | 4/2004 |

(Continued)

OTHER PUBLICATIONS

English translation of Official Communication issued in corresponding International Application PCT/JP2009/002790, mailed on Feb. 17, 2011.

(Continued)

*Primary Examiner* — Robert L. Deberadinis
(74) *Attorney, Agent, or Firm* — Keating & Bennett, LLP

(57) ABSTRACT

A contactless power feed type traveling vehicle system prevents and minimizes leakage of the magnetic field from a power feed cable and includes an AC power source, a power feed cable, a power reception pickup, and a magnetic field reducing section. The power feed cable is connected to the AC power source. The power reception pickup is provided on a traveling vehicle and arranged to receive electric power through the power feed cable in a contactless fashion. The magnetic field reducing section includes a coil antenna and a capacitor. An induced electric current flows in the coil antenna due to a magnetic field generated by an electric current flowing in the power feed cable. A resonance relationship is established between the coil antenna and the capacitor such that the induced electric current in the coil antenna is out of phase or in opposite phase with the electric current flowing in the power feed cable.

4 Claims, 9 Drawing Sheets

(56) References Cited

FOREIGN PATENT DOCUMENTS

| | | |
|---|---|---|
| JP | 2004-224179 A | 8/2004 |
| JP | 2005-261200 A | 9/2005 |
| JP | 2005-289101 A | 10/2005 |
| JP | 2007-082383 A | 3/2007 |

OTHER PUBLICATIONS

Official Communication issued in International Patent Application No. PCT/JP2009/002790, mailed on Sep. 8, 2009.

TRAVELING VEHICLE SYSTEM

BACKGROUND OF THE INVENTION

1. Field of the Invention

The present invention relates to a traveling vehicle system, particularly to a traveling vehicle system in which electric power is fed to the traveling vehicle using a contactless power feed arrangement.

2. Description of the Related Art

There is a known technology for a conveying vehicle configured to travel along a path for carrying articles in a clean room (e.g., in a semiconductor manufacturing plant), where dust production is a problem. An electric motor is typically used as a drive source for such a conveying vehicle. Electric power is supplied to the motor by electromagnetic induction from two power feed cables provided along the path of the conveying vehicle.

A method by which electromagnetic induction is utilized to conduct contactless power feeding will now be explained.

The two power feed cables are held in a power feed cable holder of a power feed rail provided along the path. A core that is made of ferrite and has a generally E-shaped cross sectional shape is fixed to an electric power receiving unit of the conveying vehicle. A coil is wounded onto a middle protruding piece of the core and the protruding piece is arranged between the two power feed cables such that it does not contact the power feed cables. When a high-frequency electric current is passed through the power feed cables, a magnetic field is generated and the magnetic field acts on the coil wound onto the core, causing an electric current to be induced in the coil. In this way, electric power is supplied from the power feed cables to the electric power receiving unit of the conveying vehicle in a contactless manner and the electric power is used by the motor and control devices (e.g., see Japanese Laid-open Patent Publication No. 2002-234366).

A semiconductor manufacturing plant has various apparatuses for processes such as inspection, exposure, impurity injection, etching, etc., and a traveling vehicle moves semiconductor wafers between loading ports of the processing apparatuses.

As explained above, the power feed cables used to supply electric power to the traveling vehicle system in a contactless manner generate a magnetic field and a portion of the magnetic field leaks to the outside from the power feed rail.

The inventor of the invention described and claimed in the present application, as set forth in more detail below, has discovered that there is a possibility that magnetic field leakage from the power feed rail will affect processing equipment used in a semiconductor manufacturing plant where the traveling vehicle system is used, particularly inspection equipment. For example, the inventor has discovered that when a semiconductor wafer having a line gap of 45 nm, for example, is inspected with a laser in an electron beam inspection apparatus, a magnetic field from the power feed cables sometimes affects a positioning function of the inspection apparatus and causes an incorrect measurement to occur. In particular, as semiconductor design rules progress toward smaller nodes, the problem of incorrect measurements becomes more of a concern.

SUMMARY OF THE INVENTION

Preferred embodiments of the present invention provide a contactless power feed type traveling vehicle system that prevents and minimizes a leakage of the magnetic field from a power feed cable.

A contactless power feed system according to a preferred embodiment of the present invention includes an AC power source, a power feed cable, a power reception pickup, and a magnetic field reducing section. The power feed cable is connected to the AC power source. The power reception pickup is provided on a traveling vehicle and arranged to receive electric power through the power feed cable in a contactless fashion. The magnetic field reducing section includes a coil antenna and a capacitor. An induced electric current flows in the coil antenna due to a magnetic field generated by an electric current flowing in the power feed cable. A resonance relationship is established between the coil antenna and the capacitor such that the induced electric current in the coil antenna is out of phase or in opposite phase with the electric current flowing in the power feed cable.

In this system, the capacitor causes the induced current in the coil antenna out of phase with the current in the power feed cable. That is, a magnetic field generated from the coil antenna is out of phase with the magnetic field generated through the power feed cable. As a result, the leaked magnetic field from the power feed cable can be canceled out by the magnetic field having a reversed phase. Here, "cancel out" means that at least a portion of the magnetic field can be canceled out such that the effect imposed on other apparatuses is reduced.

With this system, a power source or a pickup coil is not required to generate a current in the coil antenna.

In another preferred embodiment of the present invention, the coil and the capacitor are not in a perfect resonance relationship and, instead, a frequency close but not equal to a resonance frequency is used. Thus, the phase of the electric current induced in the coil antenna is not completely out of phase with the current flowing in the power feed cable. By using a state that is offset from a perfect resonance state, a magnetic field that is out of phase to an appropriate degree to cancel out the leaked magnetic field can be generated from the coil antenna.

The capacitor is preferably arranged to achieve such a resonance relationship that the magnetic field generated by the electric current induced in the coil antenna cancels out the electric current flowing in the power feed cable.

A magnetic field reducing method for a contactless power feed system according to another preferred embodiment of the present invention is a magnetic field reducing method for a contactless power feed system having an AC power source, a power feed cable connected to the AC power source, and a power reception pickup that is provided on a traveling vehicle and arranged to receive electric power through the power feed cable in a contactless fashion. The method includes the following steps of preparing a coil antenna; and preparing a capacitor by adjusting a resonance relationship with respect to the coil antenna such that a magnetic field generated by an induced electric current flowing in the coil antenna cancels out a magnetic field generated by an electric current flowing in the power feed cable.

With this method, the resonance relationship between the capacitor and the coil antenna can be adjusted by exchanging the capacitor. More particularly, a magnetic field that is out of phase to an appropriate degree can be generated by exchanging the capacitor so as to achieve a resonance state that is offset from a perfect resonance state.

The adjusting of the resonance relationship includes a step of adjusting a phase $\theta$ of the induced current in the coil antenna and a magnetic field H generated at the coil antenna by the induced current using the following relationships:

Impedance Z of a circuit including the coil antenna and the capacitor=$\omega L - 1/\omega C$;

Induced voltage Vc generated across coil antenna=−N×dΦ/dt
Induced current I generated in coil antenna=Vc/Z;
Magnetic field H generated at the coil antenna by the induced current=I/(4πr)×[J(J²+r²)⁻¹ᐟ²];
Phase θ of the induced current=cos⁻¹(R/Z), where
L is an inductance of the coil antenna, C is a capacitance of the capacitor, N is the number of windings of the coil antenna, dΦ/dt is a rate of change of a magnetic flux in the coil antenna, r is a distance from the coil antenna to a magnetic flux that is to be reduced, J is a length of the coil antenna, and R is a DC resistance of the coil antenna.

With this method, the values of the coil antenna and the capacitor can be calculated in advance.

With a traveling vehicle system according to various preferred embodiments of the present invention, the magnetic field generated by a power feed cable can be cancelled out with a magnetic field having an opposite phase generated by a coil antenna.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be explained with reference to the drawings.

Figure 1:
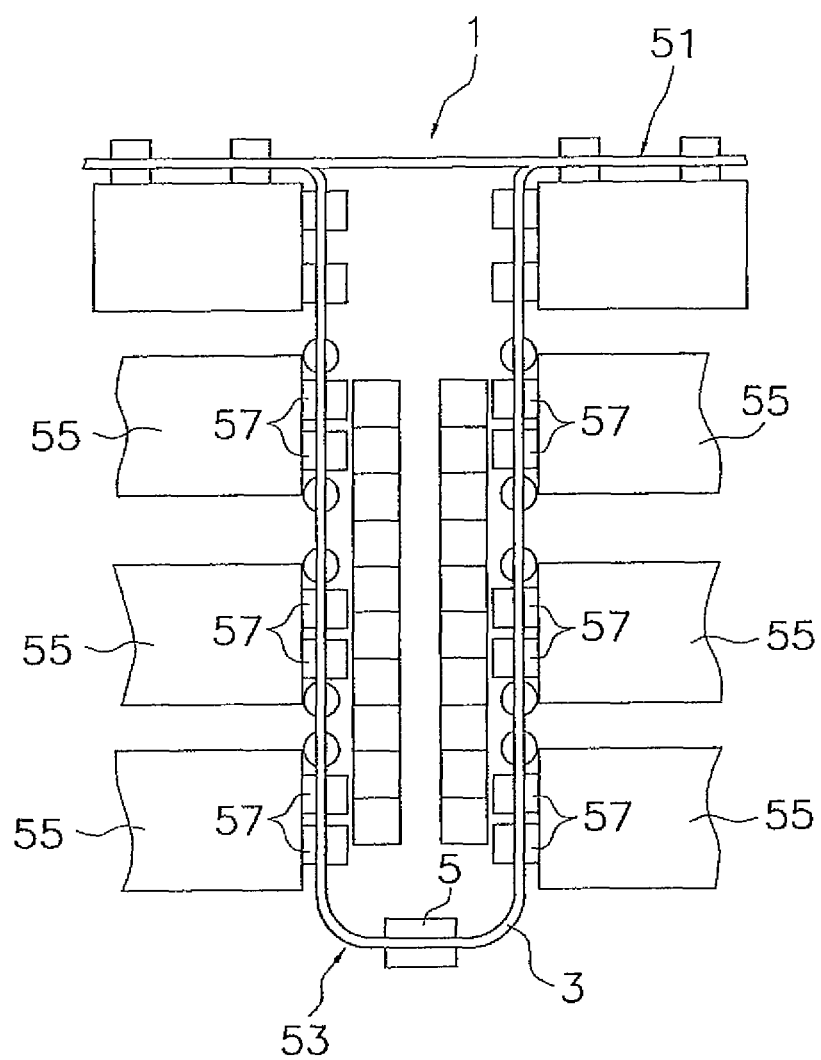
FIG. 1 is a schematic view of an overhead traveling vehicle system inside a clean room.

FIG. 1 is a schematic view of a contactless power feed type overhead traveling vehicle system 1 that uses a power feed cable. The overhead traveling vehicle system 1 is installed in a semiconductor plant or other clean room environment and serves to transport a FOUP (front opening unified pod) that will be explained later. The overhead traveling vehicle system 1 preferably includes a rail 3 and an overhead traveling vehicle 5 arranged to travel along the rail 3.

The inside of the semiconductor plant will now be explained. The semiconductor plant includes a plurality of bays (processes), and an inter-bay route 51 is provided to connect remote bays to one another. An intra-bay route 53 is also provided within each bay. Each of the routes 51 and 53 includes a rail 3.

A plurality of processing apparatuses 55 and 55, e.g., semiconductor processing apparatuses, are arranged along the intra-bay routes 53. Additionally, a loading port 57 is provided near each of the processing apparatuses 55 and 55. The loading ports 57 are provided directly under the intra-bay routes 53. Thus, the overhead traveling vehicle 5 travels along the rail 3 and transports FOUPs between loading ports 57.

Figure 2:
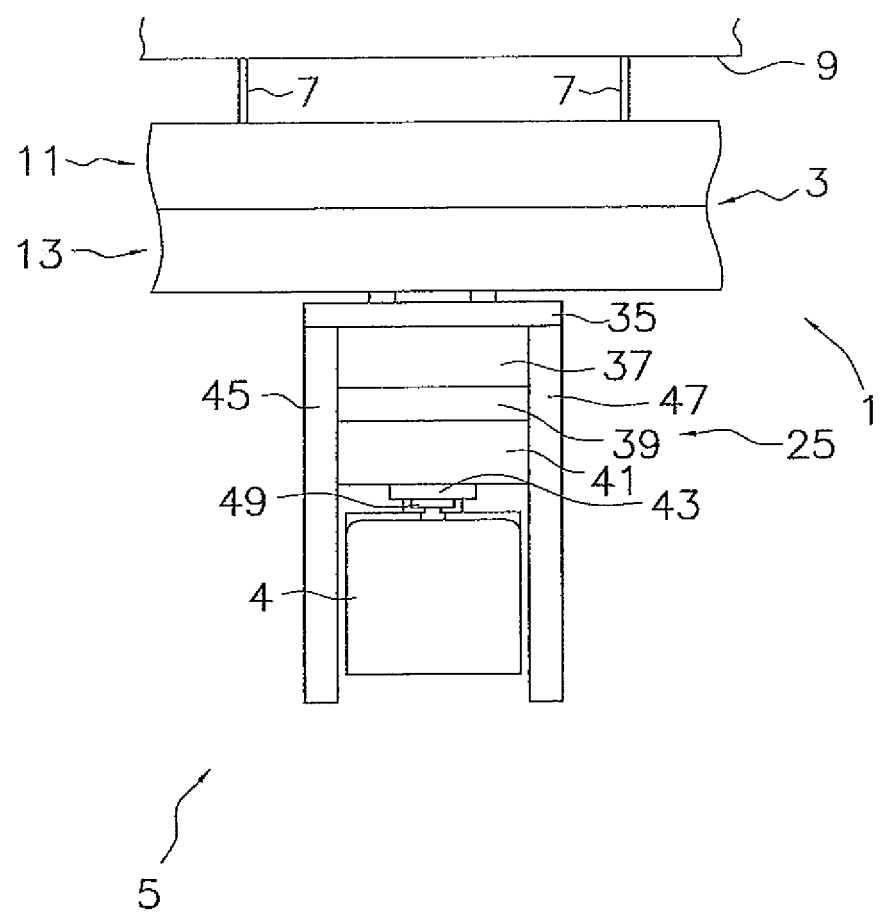
FIG. 2 is a partial side view of an overhead traveling vehicle system and an overhead traveling vehicle.

As shown in FIG. 2, the rail 3 is suspended from a ceiling 9 with a plurality of columns 7. The rail 3 preferably includes a traveling rail 11 and an electric power supply rail 13 provided on a bottom portion of the traveling rail 11.

Figure 3:
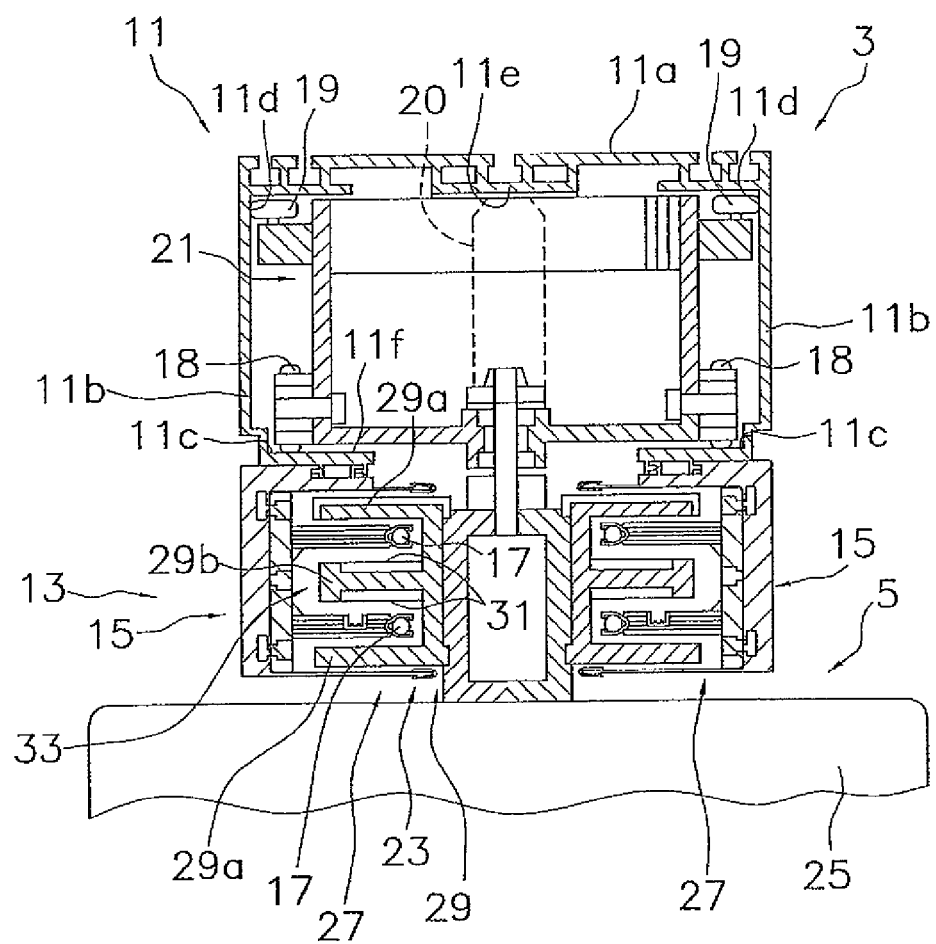
FIG. 3 is a vertical cross sectional view of an inside of a rail.

The traveling rail 11 is made of, for example, aluminum. As shown in FIG. 3, the traveling rail 11 is preferably shaped like an inverted U in a cross sectional view and has an upper surface section 11a and two side surface sections 11b. A pair of inwardly extending first traveling surfaces 11c is provided below the side surface sections 11b. A second traveling surface 11d is provided on an inside surface of an upper portion of each of the side surface sections 11b, and a third traveling surface 11e is provided on an underside surface of the upper surface section 11a.

The electric power supply rail 13 preferably includes a pair of power feed cable holders 15 and 15 provided on both sides of a lower portion of the traveling rail 11. Arranged on the power feed cable holders 15 and 15 is a pair of power feed cables 17 and 17, each preferably including a litz wire made of a copper wire or other conductive wire covered with an insulating material. An electric power supply device (not shown) is provided at one end of the power feed cables 17 and serves to supply a high-frequency electric current to the pair of power feed cables 17 and 17.

The overhead traveling vehicle 5 preferably includes a traveling section 21, an electric power receiving section 23, and a hoist driving section 25. The traveling section 21 is a mechanism arranged inside the traveling rail 11 to travel along the rail 3. The electric power receiving section 23 is a mechanism arranged inside the electric power supply rail 13 to receive electric power from the pair of power feed cables 17 and 17. The hoist driving section 25 is a mechanism arranged below the electric power supply rail 13 to hold and hoist a FOUP 4 up and down.

The traveling section 21 is arranged inside the traveling rail 11 and includes a pair of first guide wheels 18 and 18, a pair of second guide wheels 19 and 19, a travel driving wheel 20, and a motor 22. The two first guide wheels 18 and 18 are arranged on both sides of a lower portion of the traveling section 21 and rotatably supported on an axle extending in a left-and-right direction, with respect to the traveling direction of the vehicle. The first guide wheels 18 and 18 are arranged on the first traveling surfaces 11c of the traveling rail 11.

The second guide wheels 19 and 19 are arranged on both sides of an upper portion of the traveling section 21 and rotatably supported on an axle extending in a vertical direction. The second guide wheels 19 and 19 use the second traveling surfaces 11d of the traveling rail 11 as guide surfaces and prevent the position of the vehicle from drifting in a transverse direction (left-and-right direction with respect to an advancement direction).

The travel driving wheel 20 is arranged in an approximate center of the traveling section 21 and is pressed against the third traveling surface 11e of the traveling rail 11 with a spring or other pressing member. The travel driving wheel 20 is driven with the motor 22. As a result, the overhead traveling vehicle 5 travels along the rail 3.

The electric power receiving section 23 includes a pair of pickup units 27 to obtain electric power from the pair of power feed cables 17 and 17. More specifically, the two pickup units 27 and 27 are arranged transversely adjacent to each other inside the electric power supply rail 13. Each of the pickup units 27 has a generally E-shaped cross sectional shape and includes a core 29 made of ferrite and a pickup coil 31 wound onto the core 29. The core 29 includes two protruding sections 29a and a middle protruding section 29b arranged in between. The pickup coil 31 is wound onto the middle protruding section 29b.

The two power feed cables 17 and 17 held in a power feed cable holder 15 are arranged between the middle protruding section 29b and the respective protruding sections 29a. When a high-frequency current is passed through the pair of power feed cables 17 and 17, a magnetic field is generated which acts on the pickup coil 31 and generates an induced current in the pickup coil 31. In this way, electric power is supplied from the pair of power feed cables 17 and 17 to the pickup unit 27 in a contactless manner such that the travel motor 22 is driven and electric power is supplied to control devices. The pair of power feed cables 17 and 17 of the electric power supply rail 13 and the electric power receiving section 23 of the overhead traveling vehicle 5 constitute a contactless power feed section 33.

As shown in FIG. 2, the hoist driving section (hoist) 25 preferably includes a main body frame 35, a lateral feeding section 37, a θ drive 39, a hoist body 41, and a hoist table 43.

The main body frame 35 is a member fixed to a bottom portion of the electric power receiving section 23. A frontward frame 45 and a rearward frame 47 are provided respectively on front and rear sides of the main body frame 35.

Figure 4:
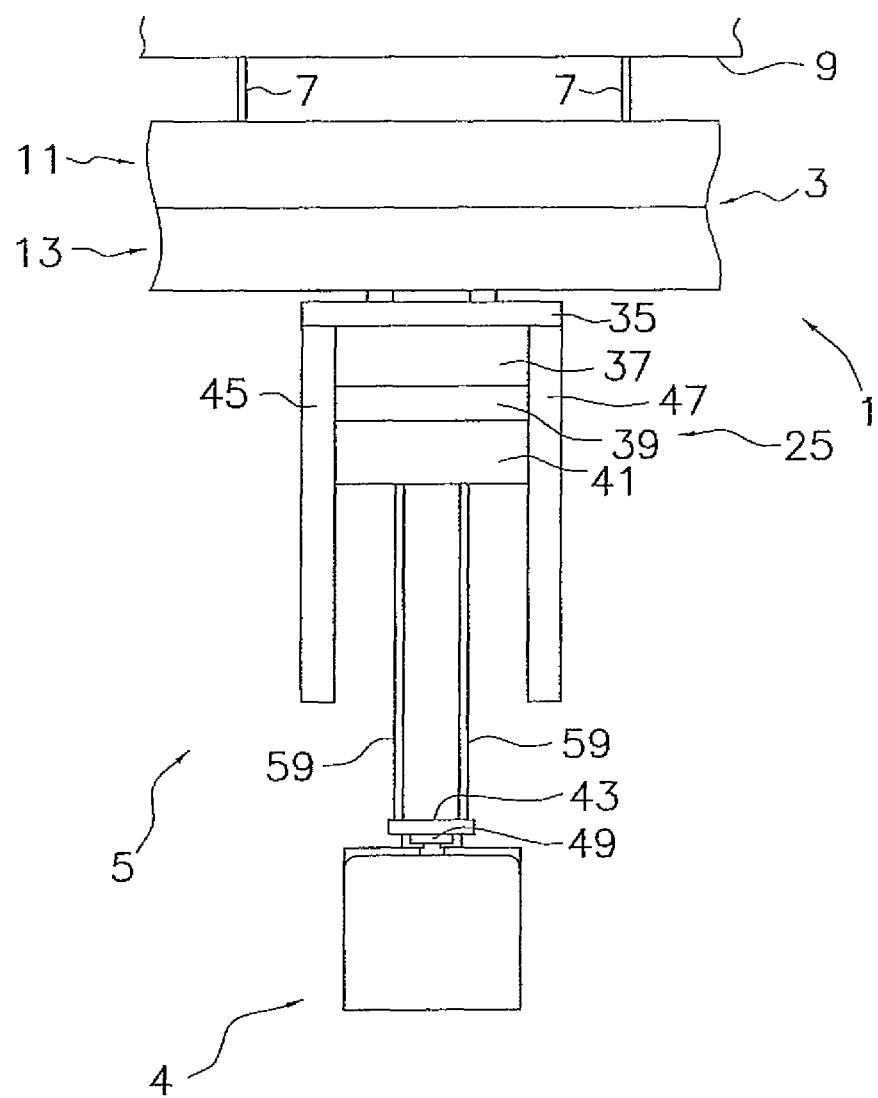
FIG. 4 is a partial side view of an overhead traveling vehicle system and an overhead traveling vehicle.

The lateral feeding section 37 feeds the θ drive 39, the hoist body 41, and the hoist table 43 in, for example, a sideways direction and can transfer a FOUP 4 to and from a side buffer (non shown) provided on a side of the rail 3. The θ drive 39 turns the hoist body 41 within a horizontal plane to make it easier to transfer a FOUP 4. A hoisting device (not shown) is provided inside the hoist body 41 to raise and lower the hoist table 43. The hoisting device includes, for example, four sets of winding drums and a belt 59 arranged around the winding drums. The hoist table 43 is attached to an end portion of the belt 59. FIG. 4 depicts a state in which the belt 59 has been reeled out from the drums such that the hoist table 43 is lowered along with a FOUP 4.

The FOUP 4 houses a plurality of semiconductor wafers inside and has a removable lid provided on a front surface thereof. A flange 49 is provided on an upper portion of the FOUP 4 and the flange 49 is held by the hoist table 43.

Figure 6:
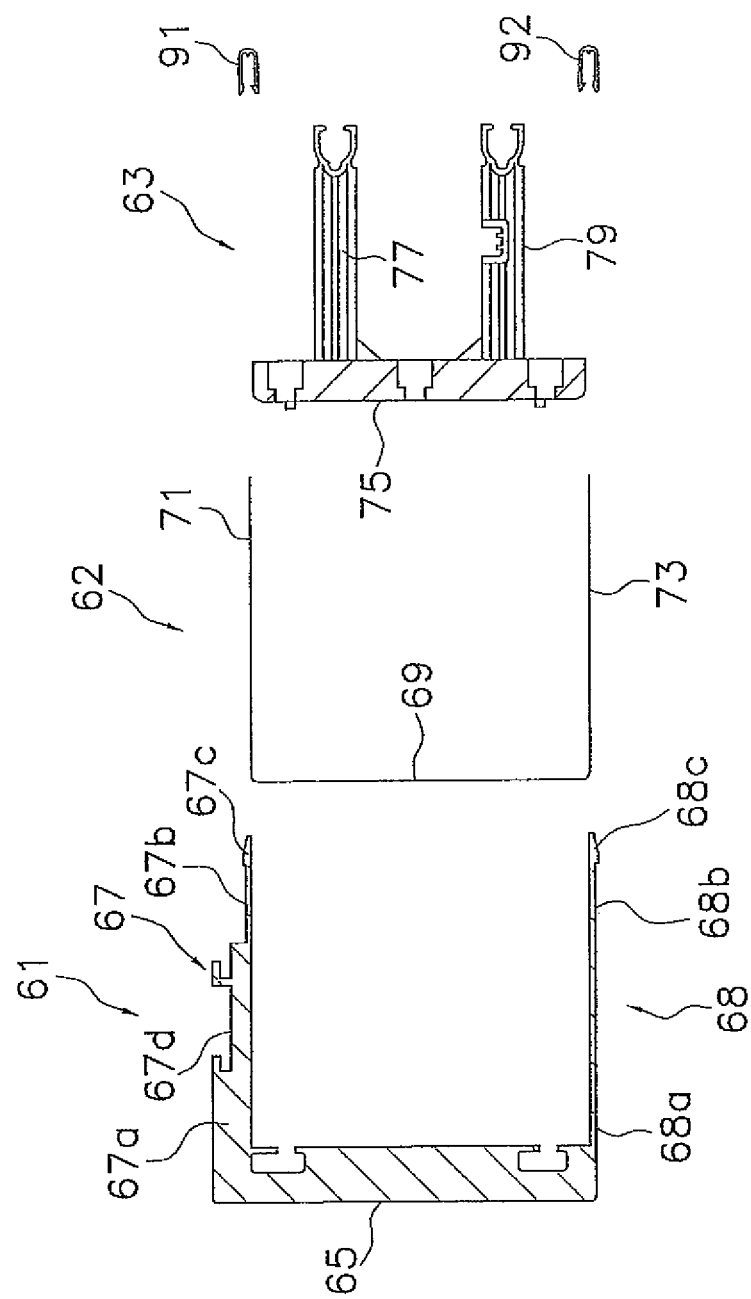
FIG. 6 is an exploded view showing the various portions of the power feed unit.
Figure 7:
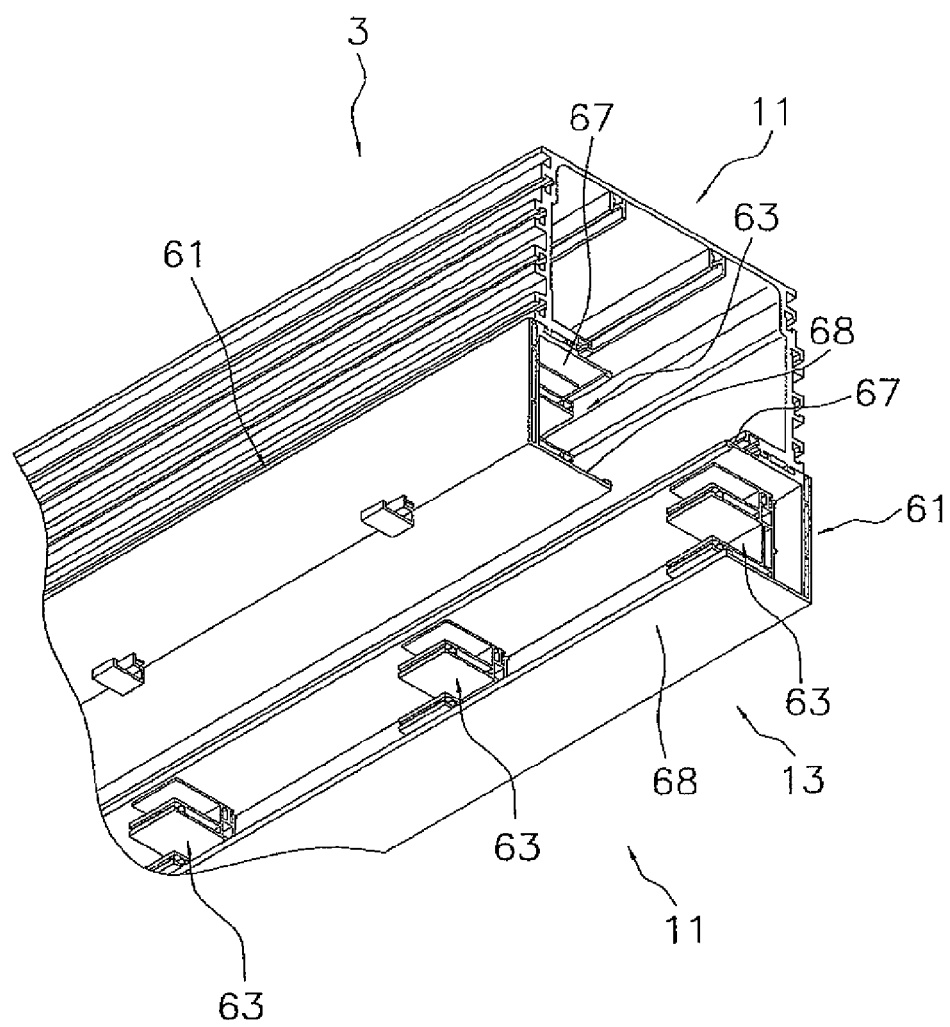
FIG. 7 is a partial perspective view of a rail.

The structure of the power feed cable holders 15 will now be explained using FIGS. 5 to 7. Since the structures of both of the power feed cable holders 15 and 15 preferably are generally the same, the structure of only one will be explained.

The power feed cable holder 15 preferably includes an outside holder 61, a plate member 62, and a plurality of inside holders 63. The outside holder 61 and the plate member 62 have prescribed corresponding lengths, and the inside holders 63 are provided with respect to the assembled pair including the outside holder 61 and the plate member 62.

The outside holder 61 preferably is a one piece integral unit made of a resin and has a main surface section 65 and a pair of side surface sections 67 and 68 that extend laterally from edge portions of the main surface section 65. The main surface section 65 extends perpendicularly or substantially perpendicularly to the plane of the paper in FIGS. 5 and 6 and extends vertically in a cross section. The side surface sections 67 and 68 also extend in the direction perpendicular or substantially perpendicular to the plane of the paper alongside the main surface section 65 and in a rightward horizontal direction from the edge portions of the main surface section 65. The side surface section 67 has a first portion 67a on a near-base side and a second portion 67b that extends from the first portion 67a. The second portion 67b is thinner than the first portion 67a and has a high degree of flexibility. A bent section 67c that is bent inward into a hook-like shape is provided on a tip end of the second portion 67b. The side surface section 68 includes a first portion 68a on a near-base side and a second portion 68b that extends from the first portion 68a. The second portion 68b has a high degree of flexibility compared to the first portion 68a. A bent section 68c that is bent inward into a hook-like shape is provided on a tip end of the second portion 68b.

An engaging section 67d is provided on the side surface section 67 of the outside holder and engages with an engaging section 11f (FIG. 3) provided on a bottom surface of the traveling rail 11. With this structure, the power feed rail 13 is fixed to the traveling rail 11.

The plate member 62 preferably is a plate made of thin copper sheet metal and preferably includes a main surface section 69 and a pair of side surface sections 71 and 73 that extend laterally from edge portions of the main surface section 69. The thickness of the plate member 62 is, for example, about 0.3 mm and the thickness is preferably in a range from about 0.2 mm to about 0.4 mm, for example. The main surface section 69 extends perpendicularly or substantially perpendicularly to the plane of the paper in FIGS. 5 and 6 and extends vertically in a cross section. The side surface sections 71 and 73 also extend in the direction perpendicular or substantially perpendicular to the plane of the paper along side the main surface section 69 and in a rightward horizontal direction from the edge portions of the main surface section 69. The plate member 62 has a same shape as an inside surface of the outside holder 61 and is held in close contact with the inside surface of the outside holder 61. Thus, the main surface section 69 of the plate member 62 is in close contact with the inside surface of the main surface section 65 of the outside holder 61. Similarly, the side surface section 71 of the plate member 62 is in close contact with the inside surface of the side surface section 67 of the outside holder 61, and the side surface section 73 of the plate member 62 is in close contact with the inside surface of the side surface section 68 of the outside holder 61. Once installed, tip ends of the side surface sections 71 and 73 of the plate member 62 are respectively arranged inside the bent sections 67c and 68c.

Each of the inside holders 63 is preferably a one-piece integral member made of resin. As shown in FIG. 7, the inside holders 63 are arranged at prescribed intervals in the assembled unit of the outside holder 61 and the plate member 62. The inside holders 63 are preferably arranged at a pitch of, for example, about 250 mm to about 300 mm. Each of the inside holders 63 preferably includes a main surface section 75, two power feed cable holding sections 77 and 79 arranged such that they extend laterally from two intermediate locations on the main surface section 75, and two side surface sections 81 and 83 extending laterally from edge portions of the main surface section 75. An outside surface of the inside holder 63 has generally the same shape as the inside surface of the outside holder 61. Thus, the inside holders 63 fit into the outside holder 61. The tip ends of the side surface sections 81 and 83 touch against or are in close proximity to the bent tip end surfaces of the bent sections 67c and 68c of the outside holder 61. Once installed, the inside holders 63 are in a state of slight elastic deformation and are secured in place in the outside holder 61 by their own elastic forces. The inside holders 63 not only secure themselves in the outside holder 61 but also secure the plate member 62 in the outside holder 61 because the plate member 62 is sandwiched between the outside holder 61 and the inside holders 63.

As shown in FIG. 3, the two power feed cables 17 are held by the tip ends of the power feed cable holding sections 77 and 79 and arranged deep inside the respective spaces between the protruding sections 29a and the protruding section 29b of the core 29.

Since a plurality of inside holders 63 are arranged in a dispersed manner, a large portion of the main surface section 69 of the plate member 62 remains exposed. Consequently, it is difficult for the inside holders 63 to impose a reducing effect on magnetic flux.

Figure 5:
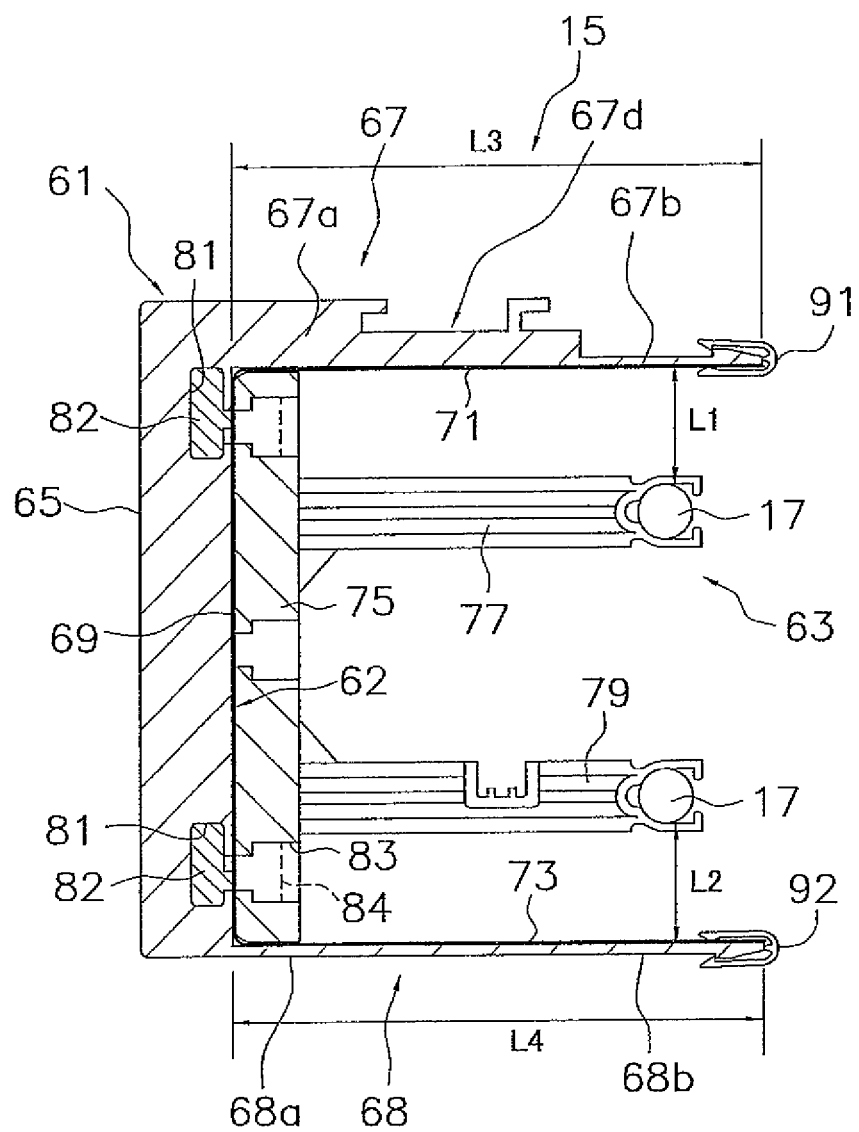
FIG. 5 is a vertical cross sectional view of a power feed unit.

As is clear in FIG. 5, the distance L1 from one of the power feed cables 17 and 17 to the closer side surface section 71 of the plate member 62 is equal to the distance L2 from the other of the power feed cables 17 and 17 to the closer side surface section 73. In the figure, L1 and L2 are the shortest distances between the elements. The magnetic fields emanating from the power feed cables 17 and 17 do not readily leak to the outside because the plate member 62 is non-magnetic. As a result, processing apparatuses are less likely to be adversely affected by magnetic field leakage. More specifically, since the plate member 62 preferably is made of copper (which has a high conductivity), it has a strong effect of reducing magnetic flux leakage. Also, providing the plate member 62 improves a power feeding efficiency because a magnetic circuit of the core 29 forms a closed loop when electric power is fed via electromagnetic induction.

Since the distances L1 and L2 between the respective power feed cables 17 and 17 and the closer of the two side surface sections 71 and 73 of the plate member 62, respectively, are equal, a balance can be maintained between the magnetic fields generated by the two power feed cables 17 and 17. As a result, the effect of preventing and minimizing adverse effects on other apparatuses caused by magnetic field leakage is strengthened.

The length L3 by which the side surface section 71 of the plate member 62 extends from the main surface section 69 is the same as the length L4 by which the side surface section 73 extends from the main surface section 69, and the two side surface sections 71 and 73 extend to such a position that tip end portions thereof cover the power feed cables 17. Here, "the side surface sections 71 and 73 cover the power feed cables 17 and 17" means that the tip ends of the side surface sections 71 and 73 extend farther toward the outside in a lateral direction than the laterally outermost portions of the power feed cables 17 and 17. Since the lengths by which the two side surface sections 67 and 68 extend from the main surface section 69 are the same, a balance can be maintained between the magnetic fields generated by the two power feed cables 17 and 17. As a result, the effect of preventing and minimizing adverse effects on other apparatuses caused by magnetic field leakage is strengthened. Also, since the tip ends of the side surface sections 71 and 73 of the plate member 62 extend to such positions that they cover the power feed cables 17 and 17, the magnetic fields emanating from the two power feed cables 17 and 17 do not readily leak to the outside.

Since the plate member 62 is arranged on a side of the outside holder 61 where the two power feed cables 17 and 17 are arranged, i.e. on the inside of the outside holder 61, dust from the plate member 62 is not likely to escape to the outside even if another object collides against the overhead traveling vehicle system 1. As a result, an overhead traveling vehicle system according to this preferred embodiment of the present invention is not likely to cause a problem when it is used in a clean room.

Since the inside holders 63 function both to hold the plate member 62 and to hold the pair of power feed cables 17 and 17, the number of components of the system can be reduced.

Assembly and disassembly of the power feed cable holder 15 will now be explained. First, the plate member 62 is fitted into the inside of the outside holder 61. When this is done, the second portion 67b of the side surface section 67 and the second portion 68b of the side surface section 68 of the outside holder 61 are flexed outward and the tip ends of the plate member 62 are fitted inside the bent sections 67c and 68c. In this state, the plate member 62 is loosely secured in the outside holder 61. Next, the inside holders 63 are fitted inside the outside holder 61, i.e., inside the plate member 62. This completes the assembly of the power feed cable holder 15. Disassembly is accomplished by reversing the steps of assembly described above.

Since there are a plurality of inside holders 63, the work of assembling and disassembling the holder can be accomplished more easily. More specifically, since the inside holders 63 are smaller than the outside holder 61 and the plate member 62, they can be installed without having to be positioned precisely with respect to the outside holder 61 and the plate member 62. Removal of the inside holders 63 can also be accomplished more easily because the smaller members can be removed one at a time.

Figure 8:
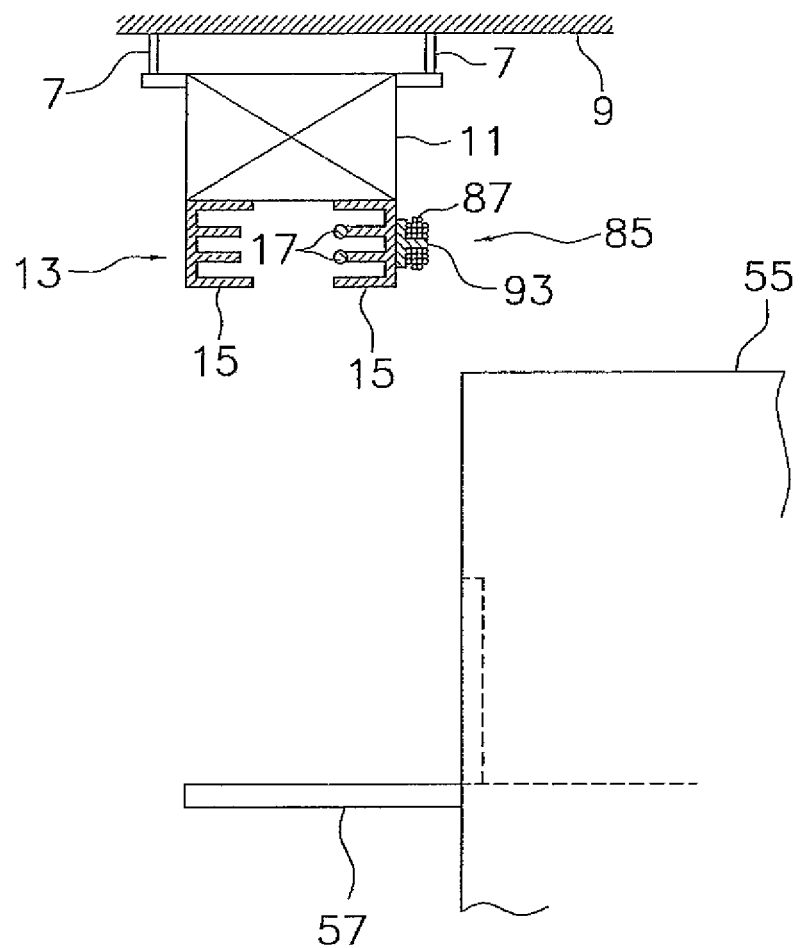
FIG. 8 is a simple sketch showing a positional relationship between the rail, a processing apparatus, and a noise canceling circuit.
Figure 9:
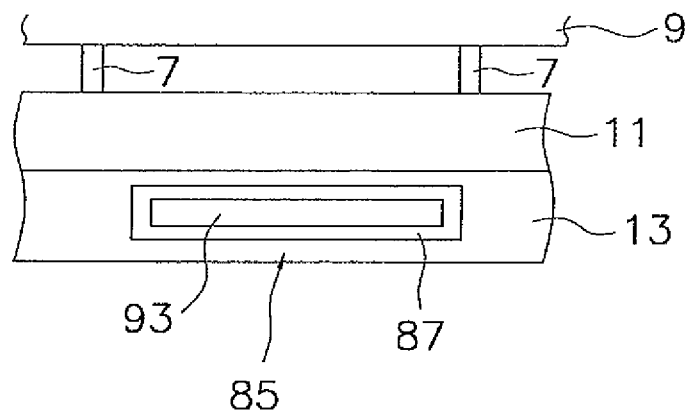
FIG. 9 is a side view of an antenna attached to a rail.
Figure 10:
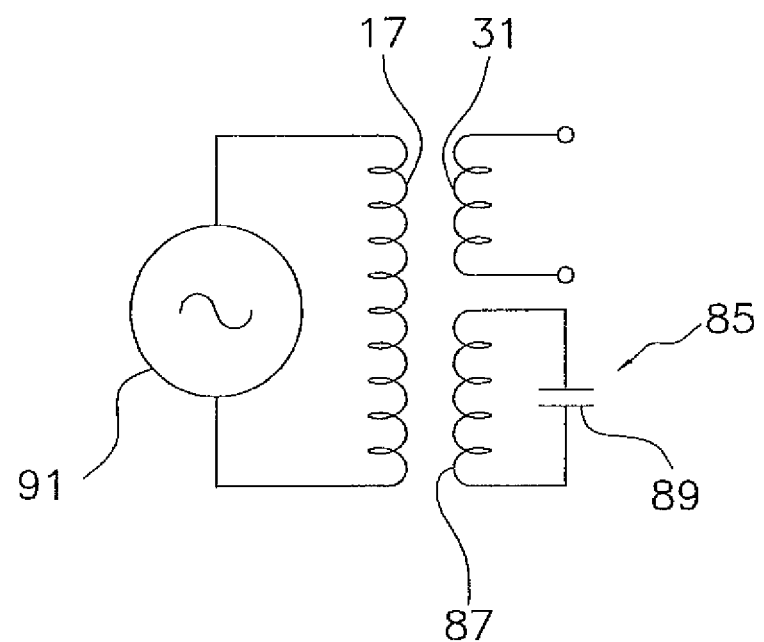
FIG. 10 is an equivalent circuit of a contactless power feed section and a noise canceling circuit.

As shown in FIGS. 8 to 10, a noise canceling circuit 85 is installed in the rail 3. The noise canceling circuit 85 functions to reduce a magnetic field emanating from the power feed rail 13.

As shown in FIG. 10, the noise canceling circuit 85 is a resonance circuit preferably including a coil antenna 87 and a capacitor 89. The coil antenna 87 preferably includes a plurality of elongated windings that extend parallel or substantially parallel to a lengthwise direction of the rail 3. As shown in FIGS. 8 and 9, the coil antenna 87 is arranged on an outside portion of the power feed cable holder 15, i.e., in a position outward of the power feed cables 17 but close to the power feed cables 17. In FIGS. 8 and 9, the coil antenna 87 is fixed to the power feed cable holder 15 through a mounting member 93. The capacitor 89 serves to reverse the phase of the induced current flowing in the coil antenna 87 with respect to the phase of the current flowing in the power feed cables 17.

It is acceptable to provide the coil antenna 87 throughout the entire rail 3 or only in locations corresponding to processing apparatuses 55 for which it is necessary. Providing the coil antenna "in locations corresponding to processing apparatuses 55 for which it is necessary" means arranging the coil antenna such that the length of the coil antenna in a traveling direction corresponds to at least approximately 70% of the length of the processing apparatus in the traveling direction.

When a high-frequency electric current is supplied to the power feed cables 17 from an AC power source 91 shown in FIG. 10, a magnetic field is generated around the power feed cables 17. This magnetic field causes a current to be induced in the pickup coil 31 wound onto the core 29. In short, electric power is transferred in a contactless manner.

Meanwhile, the magnetic field emanating from the power feed cables 17 induces an electric current in the coil antenna 87 of the noise canceling circuit 85 and the induced current causes a magnetic field to emanate from the coil antenna 87. With this noise canceling circuit 85, the interaction of the capacitor 89 and the coil antenna 87 causes the induced current flowing in the coil antenna 87 to be out of phase with the current flowing in the power feed cables 17. Consequently, the magnetic field emanating from the coil antenna 87 is out of phase with the magnetic field emanating from the power feed cables 17. The out-of-phase magnetic field acts to cancel out the magnetic field emanating from the power feed cables 17. Here, "cancel out" means that at least a portion of the magnetic field generated by the electric current flowing in the power feed cables 17 is canceled out. As a result, the magnetic field emanating from the power feed cables 17 has less of an adverse effect on the processing apparatus 55 (e.g. an inspection apparatus).

In this preferred embodiment, although magnetic field leakage to the outside of the power feed rail 13 is reduced due to the plate member 62, as explained previously, adverse effects of the magnetic field leakage are reduced even further because the magnetic field generated by the induced current flowing in the coil antenna 87 is out of phase with the leaked magnetic field and, thus, serves to cancel out the leaked magnetic field.

Since the coil antenna 87 includes a plurality of windings, the magnetic field leakage reduction is effective even if the induced current flowing in the coil antenna 87 is small. Also, since a lengthwise direction of the coil antenna 87 is parallel or substantially parallel to the power feed cables 17, the leaked magnetic field can be reduced along a wide span of the power feed cables 17.

Since an induced current is generated in the coil antenna 87 using the power feed cables 17 as a power source, it is not necessary to prepare a separate power source or a separate pickup coil.

The coil antenna 87 and the capacitor 89 are not in a perfect resonance relationship and, instead, a frequency in a range close to the resonance frequency is used. Thus, the phase of the electric current induced in the coil antenna 87 is not completely out of phase with respect to the electric current flowing in the power feed cables 17. By establishing a state that is offset from a perfect resonance state, the coil antenna 87 can be made to emanate a magnetic field that is out of phase to an appropriate degree to cancel out the leaked magnetic field.

The work required to accomplish magnetic field reduction involves the following steps:
A step in which a coil antenna 87 is prepared; and
A step in which a capacitor 89 is prepared by adjusting a resonance relationship with respect to the coil antenna 87 such that a magnetic field generated by an induced electric current flowing in the coil antenna 87 cancels out a magnetic field generated by an electric current flowing in the power feed cables 17.

With this method, the resonance relationship between the capacitor 89 and the coil antenna 87 can be adjusted by exchanging the capacitor 89. In particular, a magnetic field that is out of phase to an appropriate degree can be generated by exchanging the capacitor 89 so as to achieve a resonance state that is offset from a perfect resonance state.

More specifically, adjusting the resonance relationship is a step in which a phase $\theta$ of the induced current in the coil antenna 87 and a magnetic field H generated at the coil antenna 87 by the induced current are adjusted using the following relationships: impedance Z of a circuit including the coil antenna 87 and the capacitor $89 = \omega L - 1/\omega C$; induced voltage Vc generated across coil antenna $87 = -N \times d\Phi/dt$, induced current I generated in coil antenna $87 = Vc/Z$; magnetic field H generated at the coil antenna 87 by the induced current $= I/(4\pi r) \times [J(J^2+r^2)^{-1/2}]$; phase $\theta$ of the induced current $= \cos^{-1}(R/Z)$, where L is the inductance of the coil antenna 87, C is the capacitance of the capacitor 89, N is the number of windings of the coil antenna 87, $d\Phi/dt$ is a rate of change of the magnetic flux in the coil antenna 87, r is the distance from the coil antenna 87 to a magnetic flux that is to be reduced, J is the length of the coil antenna 87, and R is the DC resistance of the coil antenna 87.

With this structure, the characteristic variables of the coil antenna 87 and the value of the capacitor 89 can be calculated in advance.

Preferred embodiments of the present invention have been explained heretofore, but the present invention is not limited to the preferred embodiments described above. Various changes can be made without departing from the scope of the present invention.

Although in the previously explained preferred embodiments, the plate member preferably includes a single plate including three surfaces, it is acceptable to make the plate member out of three separate plates attached together.

Although in the previously explained preferred embodiments, the traveling vehicle system preferably is an overhead traveling vehicle system, the present invention can also be applied to other vehicle traveling systems having a vehicle that travels along a path, such as a vehicle that travels on the floor.

Although in the previously explained preferred embodiments, the traveling vehicle system is preferably used in a clean room of a semiconductor manufacturing plant, a system according to the present invention can also be used in other types of plants.

Although in the previously explained preferred embodiments, a plate member made of copper is preferably used in the power feed cable holder, the present invention can also be applied to a power feed cable holder that does not use a plate member. In such a case, it is possible that the amount of magnetic field leakage from the power feed cable holder will be large, but the out-of-phase magnetic field emanating from the coil antenna will also be larger. Consequently, the adverse effects of the leaked magnetic field on the processing equipment can be reduced in a manner similar to the previously explained preferred embodiments.

Although in the previously explained preferred embodiments, the coil antenna is preferably arranged as close as possible to the power feed cables, it is also acceptable for the coil antenna to be arranged higher or lower than the power feed cables or farther away from the power feed cables in a lateral direction.

Although in the previously explained preferred embodiments, the coil antenna is preferably attached to the power feed rail, it is also acceptable for the coil antenna to be attached to the traveling rail.

Although in the previously explained preferred embodiments, the coil antenna is preferably attached to one side of the rail, it is also acceptable if the coil antenna is attached only to the opposite side of the rail or if coil antennas are attached to both sides of the rail.

It is acceptable for the two power feed cables to be provided on both power feed cable holders or on only one of the power feed cable holders.

The present invention can be applied widely to systems including a traveling vehicle that travels along a path.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A contactless power feed system, comprising:
an AC power source;
a power feed cable connected to the AC power source;
a power reception pickup that is provided on a traveling vehicle and arranged to receive electric power through the power feed cable in a contactless fashion; and
a magnetic field reducing circuit including a coil antenna and a capacitor connected to the coil antenna, the coil antenna being arranged to carry an electric current induced therein by a magnetic field generated due to an electric current flowing in the power feed cable, a resonance relationship is established between the coil antenna and the capacitor such that the induced electric current in the coil antenna is out of phase with the electric current flowing in the power feed cable.

2. The contactless power feed system according to claim 1, wherein the capacitor is arranged to achieve the resonance relationship in which a magnetic field generated by the induced electric current in the coil antenna cancels out a magnetic field generated by the electric current flowing in the power feed cable.

3. A magnetic field reducing method for a contactless power feed system including an AC power source, a power feed cable connected to the AC power source, and a power reception pickup that is provided on a traveling vehicle and arranged to receive electric power through the power feed cable in a contactless fashion, the method includes the steps of:

preparing a coil antenna; and preparing a capacitor by adjusting a resonance relationship with respect to the coil antenna such that a magnetic field generated by an induced electric current in the coil antenna cancels out a magnetic field generated by an electric current flowing in the power feed cable.

4. The magnetic field reducing method for a contactless power feed system according to claim 3, wherein the adjusting of the resonance relationship includes a step of adjusting a phase $\theta$ of the induced current in the coil antenna and a magnetic field H generated at the coil antenna by the induced current using the following relationships:

impedance Z of a circuit including the coil antenna and the capacitor$=\omega L-1/\omega C$;

induced voltage Vc generated across the coil antenna$=-N\times d\phi/dt$;

induced current I generated in the coil antenna$=Vc/Z$;

the magnetic field H generated at the coil antenna by the induced current$=1/(4\pi r)\times[J(J^2+r^2)^{-1/2}]$;

the phase $\theta$ of the induced current$=\cos^{-1}(R/Z)$;

where L is an inductance of the coil antenna, C is a capacitance of the capacitor, N is the number of windings of the coil antenna, $6\phi/dt$ is a rate of change of a magnetic flux in the coil antenna, r is a distance from the coil antenna to a magnetic flux that is to be reduced, J is a length of the coil antenna, and R is a DC resistance of the coil antenna.

* * * * *